United States Patent
Guliani et al.

(10) Patent No.: US 6,434,073 B2
(45) Date of Patent: Aug. 13, 2002

(54) VPX BANK ARCHITECTURE

(75) Inventors: Sandeep K. Guliani, Folsom; Rajesh Sundaram, Fair Oaks; Mase J. Taub, Elk Grove, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/924,888

(22) Filed: Aug. 7, 2001

Related U.S. Application Data

(62) Division of application No. 09/410,493, filed on Sep. 30, 1999.

(51) Int. Cl.[7] ................................................. G11C 7/02
(52) U.S. Cl. .............. 365/210; 365/230.03; 365/230.06
(58) Field of Search ..................... 365/210, 51, 185.11, 365/230.03, 230.06, 185.18

(56) References Cited

U.S. PATENT DOCUMENTS

| | | | |
|---|---|---|---|
| 4,321,695 A | 3/1982 | Redwine et al. | 365/174 |
| 4,393,474 A | 7/1983 | McElroy | 365/200 |
| 4,878,203 A | 10/1989 | Arakawa | 365/226 |
| 5,886,939 A * | 3/1999 | Choi | 365/210 |
| 5,978,263 A | 11/1999 | Javanifard et al. | |
| 5,978,277 A | 11/1999 | Hsu et al. | 365/185.29 |
| 6,023,427 A | 2/2000 | Lakhani et al. | 365/185.33 |
| 6,038,169 A * | 3/2000 | Ogura | 365/185.11 |
| 6,088,286 A | 7/2000 | Yamauchi et al. | 365/230.06 |
| 6,091,659 A | 7/2000 | Watanabe et al. | 365/230.03 |
| 6,115,316 A | 9/2000 | Mori et al. | 365/230.03 |

* cited by examiner

Primary Examiner—A. Zarabian
(74) Attorney, Agent, or Firm—Peter Lam

(57) ABSTRACT

A method for a VPX banked architecture. The method of one embodiment first segments a memory array into at least two banks. Each bank including memory cells. The banks are provided with a supply voltage.

11 Claims, 5 Drawing Sheets

VPX BANK ARCHITECTURE

This patent application is a Divisional of U.S. patent application Ser.No. 09/410,493, entitled "VPX Bank Architecture", filed Sep. 30, 1999.

FIELD OF THE INVENTION

The present invention relates generally to the field of computers and computer systems. More particularly, the present invention relates to a method and apparatus for a VPX bank architecture.

BACKGROUND OF THE INVENTION

Many of today's computing applications such as cellular phones, digital cameras, and personal computers, use non-volatile memories to store data or code. Non-volatility is advantageous because it allows the computing system to retain its data and code even when power is removed from the computing system. Thus if the system is turned off or if there is a power failure, there is no loss of code or data. Such nonvolatile memories include Read-Only Memory (ROMs), Electrically Programmable Read-Only Memory (EPROMs), Electrically Erasable Programmable Read-Only Memory (EEPROMs), and flash Electrically Erasable Programmable Read-Only Memory (flash EEPROMs or flash memory).

Nonvolatile semiconductor memory devices are fundamental building blocks in computer system designs. One such nonvolatile memory device is flash memory. Flash memory can be programmed by the user, and once programmed, the flash memory retains its data until the memory is erased. Electrical erasure of the flash memory erases the contents of the memory of the device in one relatively rapid operation. The flash memory may then be programmed with new code or data. The primary mechanism by which data is stored in flash memory is a flash memory cell. Accordingly, outputs of a flash memory device are typically associated with an array of flash cells that is arranged into rows and columns such that each flash cell in the array is uniquely addressable.

A flash EEPROM memory device (cell) is a floating gate MOS field effect transistor having a drain region, a source region, a floating gate, and a control gate. Conductors are connected to each drain, source, and control gate for applying signals to the transistor. A flash EEPROM cell is capable of functioning in the manner of a normal EPROM cell and will retain a programmed value when power is removed from the circuitry. A flash EEPROM cell may typically be used to store a one or zero condition. If multilevel cell (MLC) technology is used, multiple bits of data may be stored in each flash EEPROM cell. Unlike a typical EPROM cell, a flash EEPROM cell is electrically erasable in place and does not need to be removed and diffused with ultraviolet to accomplish erasure of the memory cells.

Arrays of such flash EEPROM memory cells have been used in computers and similar circuitry as both read only memory and as long term storage which may be both read and written. These cells require accurate values of voltage be furnished in order to accomplish programming and reading of the devices. Arrays of flash EEPROM memory devices are typically used for long term storage in portable computers where their lightweight and rapid programming ability offer distinct advantages offer electro-mechanical hard disk drives. However, the tendency has been to reduce the power requirements of such portable computers to make the computers lighter and to increase the length of use between recharging. This has required that the voltage potentials available to program the flash memory arrays be reduced.

FIG. 1 is a typical prior art memory architecture 100. A charge pump 102 provides a pumped voltage potential 104. Pump voltage 104 is supplied to X-path switches 106. Logic circuits of the X-path switches 106 control the voltage potentials coupled to the X-path during read, write, and erase modes in the memory. The outputs of the X-path switches 106 are coupled to X-decoders 112, 122. Each supply voltage from the switched outputs 108 from the X-path switches 106 have to supply all the X-decoder devices 112, 122 in both planes 110, 120.

The embodiment in FIG. 1 has a memory array divided into two planes 110, 120. The first plane 110 and second plane 120 are similar in construction. Global wordlines 114, 124 from the X-decoders 112, 122 are coupled to local block selects 116, 126 in each block of the memory block in the corresponding planes 110, 120. The local block selects 116, 126 determine whether the global wordlines 114, 124 are coupled to the local wordlines 118, 128 in a block.

The X-path switches of prior art designs provided a single set of high voltages signals that are coupled to circuits for the entire memory array. A high voltage signal can be coupled to devices on both planes of memory. In other words, whenever each high voltage signal transitioned from one voltage to a higher voltage potential, that high voltage signal needed to supply current to all the circuit devices coupled to its signal. Hence, each high voltage signal has to charge up a large amount of capacitance, which increases the current and power consumption.

A number of the electronic systems that use flash memories are small portable devices that rely on batteries for power. As new applications emerge, system designers are open to alternative methods of increasing the battery life of these devices by reducing power consumption.

SUMMARY OF THE INVENTION

A method for a VPX banked architecture is described. The method comprises of one embodiment first segments a memory array into at least two banks. Each bank comprises of memory cells. The banks are provided with a supply voltage.

Other features and advantages of the present invention will be apparent from the accompanying drawings and from the detailed description that follow below.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

Figure 1:
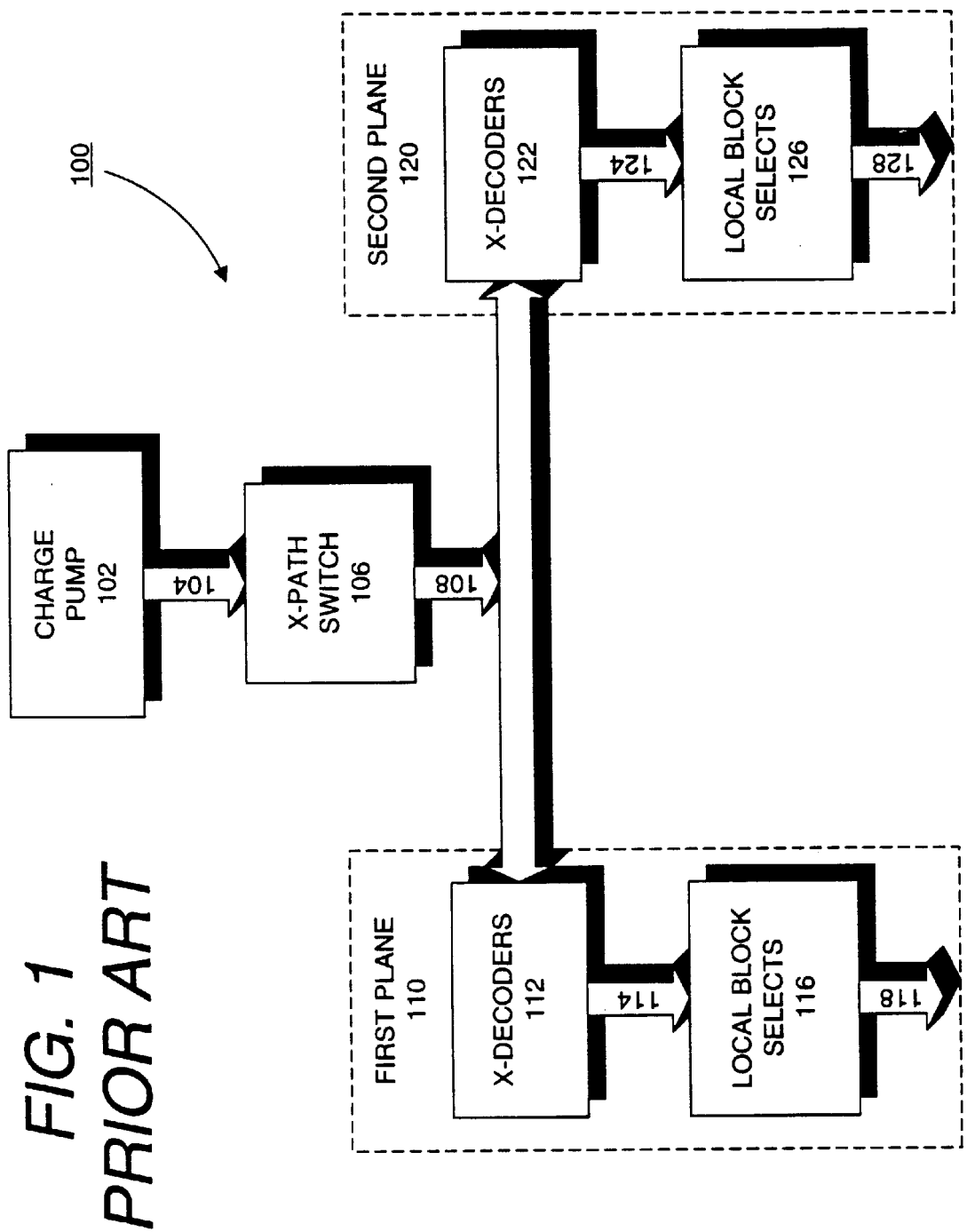
FIG. 1 is a typical prior art memory architecture.

A method and apparatus for a VPX bank architecture is disclosed. The described architecture enables banking a memory array in nonvolatile writable memory. The embodiments described herein are described in the context of a nonvolatile writable memory or flash memory, but is not so limited. Although the following embodiments are described with reference to nonvolatile writable memories and flash memory, other embodiments are applicable to other circuits that have memory arrays or voltage supplies. The same techniques and teachings of the present invention can easily be applied to other types of memory devices that use charge pumps.

Designers of portable devices have been concerned with reducing power and current consumption in order to increase system performance. However, another feature important for improving system performance is program time. Hence, memory parts having fast reads and fast programs are also desired. For instance, cell phone manufacturers have found that products having a longer battery life are more competitive in the marketplace. Hence, low power components are greatly in demand. This is really important at low voltages since the savings are very significant. Methods for reducing power consumption have included utilizing standby modes, deep power-down, and lower voltages.

But at lower voltages, programming flash memory cells becomes more difficult. First, certain circuits such as the X-decoders need to be larger in size. The X-decoders were enlarged because the read path and sensing slowed down at lower voltages. The larger size helped compensate for the performance difference. However, the amount of capacitance due to the X-decoders increased. Second, the pump efficiency of the charge pumps decrease. Third, the size of the charge pump area increases because more pump stages are required to meet the current demands.

Two different aspects relating to the supply current are important during memory programming. One is the average programming current. The higher the current requirements, the more charge that the charge pumps have to supply. The other is the time necessary to slew the supply voltage. The larger the load or capacitance coupled to a power supply node, the more time that is necessary for the node to slew up to the desired voltage potential.

One embodiment of the invention introduces a bank architecture that segments a memory array into multiple banks of memory cells and X-decoder cells. Each bank is supplied with its own set of high voltage signals. When a word is programmed in memory, the high voltage signals for the bank in which the word to be programmed resides is charged up and the high voltage signals of the other banks are left floating. Thus, the amount of capacitance to be charged during programming in one embodiment is reduced by a factor equal to the number of banks. For example, if a memory array is divided into four banks, the total capacitance to be charged is reduced by a factor of four. Furthermore, the charging current and supply slew time are reduced by a similar factor. This enhancement can be especially useful at low voltages such as 2 volts and lower. The charging current and slew time reductions are directly related to the total capacitance. The larger the capacitance, the more current that is needed from the voltage supply to charge up the capacitance, resulting in longer slew times on the supply node.

Figure 2:
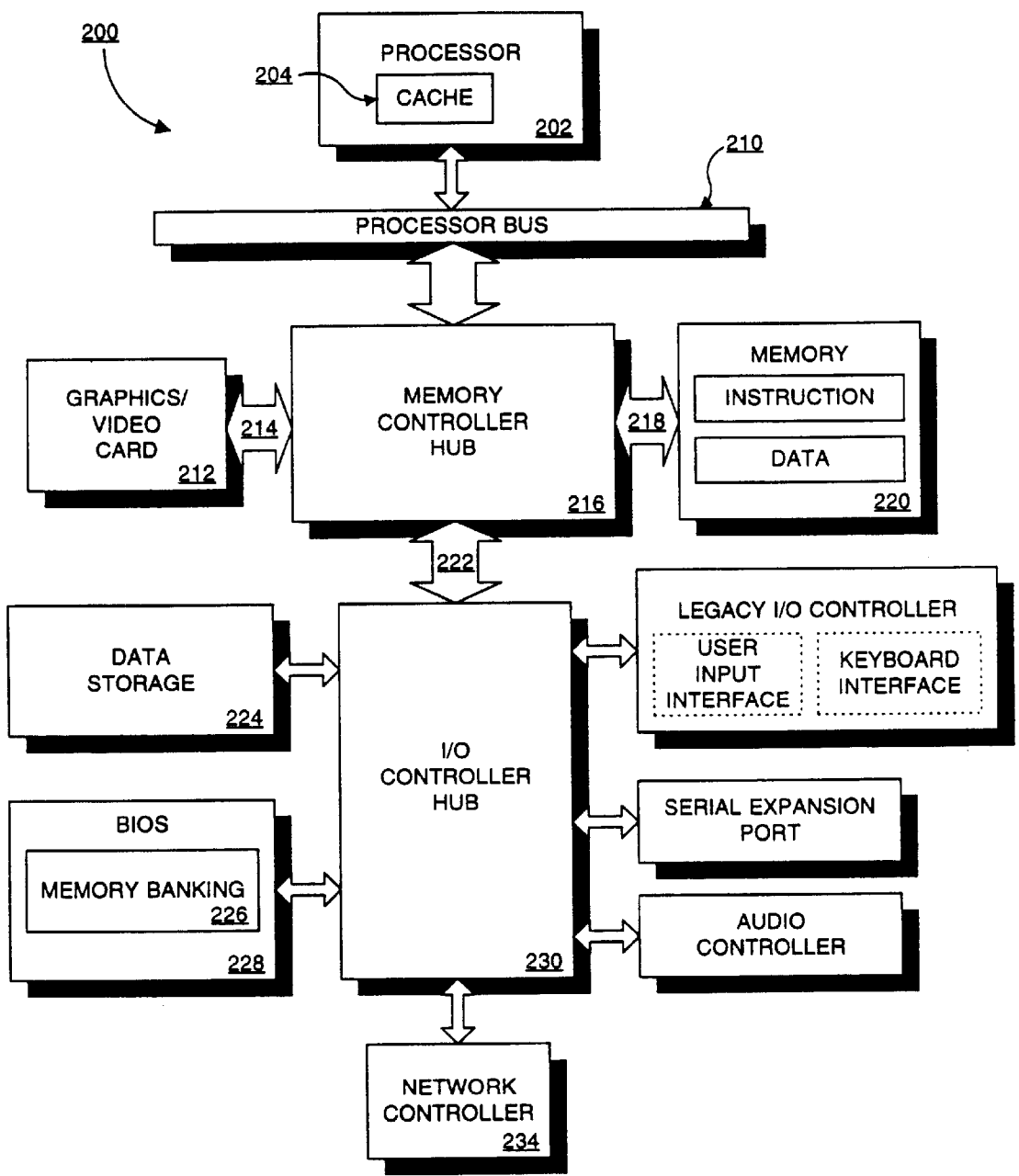
FIG. 2 is a computer system with a memory using a VPX bank architecture in one embodiment.

Referring now to FIG. 2, there is a computer system 200 that includes the present embodiment. Sample system 200 may have a memory incorporating a VPX banked memory architecture, in accordance with the present invention, such as in the embodiment described herein. Sample system 200 is representative of processing systems based on the PENTIUM®, PENTIUM® Pro, PENTIUM® II, PENTIUM® III microprocessors available from Intel Corporation of Santa Clara, Calif., although other systems (including PCs having other microprocessors, engineering workstations, set-top boxes and the like) may also be used. In one embodiment, sample system 200 may be executing a version of the WINDOWS™ operating system available from Microsoft Corporation of Redmond, Wash., although other operating systems and graphical user interfaces, for example, may also be used. Thus, the present invention is not limited to any specific combination of hardware circuitry and software.

FIG. 2 is a block diagram of a system 200 of one embodiment. System 200 is an example of a hub architecture. The computer system 200 includes a processor 202 that processes data signals. The processor 202 may be a complex instruction set computer (CISC) microprocessor, a reduced instruction set computing (RISC) microprocessor, a very long instruction word (VLIW) microprocessor, a processor implementing a combination of instruction sets, or other processor device, such as a digital signal processor, for example. FIG. 2 shows an example of an embodiment of the present invention implemented in a single processor system 200. However, it is understood that other embodiments may alternatively be implemented as systems having multiple processors. Processor 202 is coupled to a processor bus 210 that transmits data signals between processor 202 and other components in the system 200. The elements of system 200 perform their conventional functions well known in the art.

System 200 includes a memory 220. Memory 220 may be a dynamic random access memory (DRAM) device, a static random access memory (SRAM) device, flash memory device, or other memory device. Memory 220 may store instructions and/or data represented by data signals that may be executed by processor 202. A cache memory 204 can reside inside processor 202 that stores data signals stored in memory 220. Alternatively, in another embodiment, the cache memory may reside external to the processor.

A system logic chip 216 is coupled to the processor bus 210 and memory 220. The system logic chip 216 in the illustrated embodiment is a memory controller hub (MCH). The processor 202 communicates to a memory controller hub (MCH) 216 via a processor bus 210. The MCH 216 provides a high bandwidth memory path 218 to memory 220 for instruction and data storage and for storage of graphics commands, data and textures. The MCH 216 directs data signals between processor 202, memory 220, and other components in the system 200 and bridges the data signals between processor bus 210, memory 220, and system I/O 222. In some embodiments, the system logic chip 216 provides a graphics port for coupling to a graphics controller 212. The MCH 216 is coupled to memory 220 through a memory interface 218. The graphics card 212 is coupled to the MCH 216 through an Accelerated Graphics Port (AGP) interconnect 214.

System 200 uses a proprietary hub interface bus 222 to couple the MCH 216 to the I/O controller hub (ICH) 230. The ICH 230 provides direct connections to some I/O devices. Some examples are the audio controller, BIOS 228, data storage 224, legacy I/O controller containing user input and keyboard interfaces, a serial expansion port such as Universal Serial Bus (USB), and a network controller 234. The data storage device 224 can comprise a hard disk drive, a floppy disk drive, a CD-ROM device, a flash memory device, or other mass storage device. A VPX banked architecture memory 226 resides in the flash memory BIOS 228 in this embodiment. In an alternative embodiment, the BIOS 228 may be part of a firmware hub.

The present embodiment is not limited to computer systems. Alternative embodiments can be utilized in applications including cellular phones, personal digital assistants (PDAs), embedded systems, and digital cameras.

A number of circuit devices require N-wells. N-wells are needed for all P type transistors created on a P type substrate. One flash memory architecture utilizing block select and X-path decoding schemes includes a large amount of N-well area on the die. However, an N-well can contribute significantly to the capacitance on a connected node. An N-well can behave like a capacitor when the signal connected to the well transitions. Therefore, an N-well can consume current when its corresponding signal transitions.

For instance, the N-wells that are tied to the positive pump outputs or high voltage signals can draw current when the attached signal changes from one voltage potential to a higher voltage potential. When the flash memory device of one embodiment enters into its program mode from a read mode, the positive nodes are generally at the 5 volt read levels and need to be brought up to the program value. If an N-well is coupled to VPX and VPX transitions from 5 volts to 10 volts during a program sequence, then VPX also needs to supply enough charge to increase the voltage potential of the N-well. Hence, the N-wells that are tied to the positive pump outputs during program have to be included as part of the load on the program current. Charging the N-wells up to the proper program voltages can require a large amount of time and power.

An X decoder cell has a series of N-wells for its circuit devices. High voltage nodes VPX and VPIX, and the N-wells are sitting at 5 volts during read mode. Local block selects and local wordlines also contribute to the N-well area. These N-wells also sit at 5 volts during read mode. When the memory device goes into a program, these voltages can increase to approximately 9 to 12 volts.

The total amount of capacitance of the positive voltage nodes can be about 800 picofarads for one embodiment. There are a number of sources contributing to the overall capacitance including: N-well capacitance, gate capacitance, diode capacitance, junction capacitance, and gate overlap. In some memory parts, the voltage increases from 5 volts to 12 volts when the part goes from read to program. If there is 1000 picofarads of capacitance that needs to be charged from 5 volts to 12 volts, then a large amount of charge has to be supplied.

Figure 3:
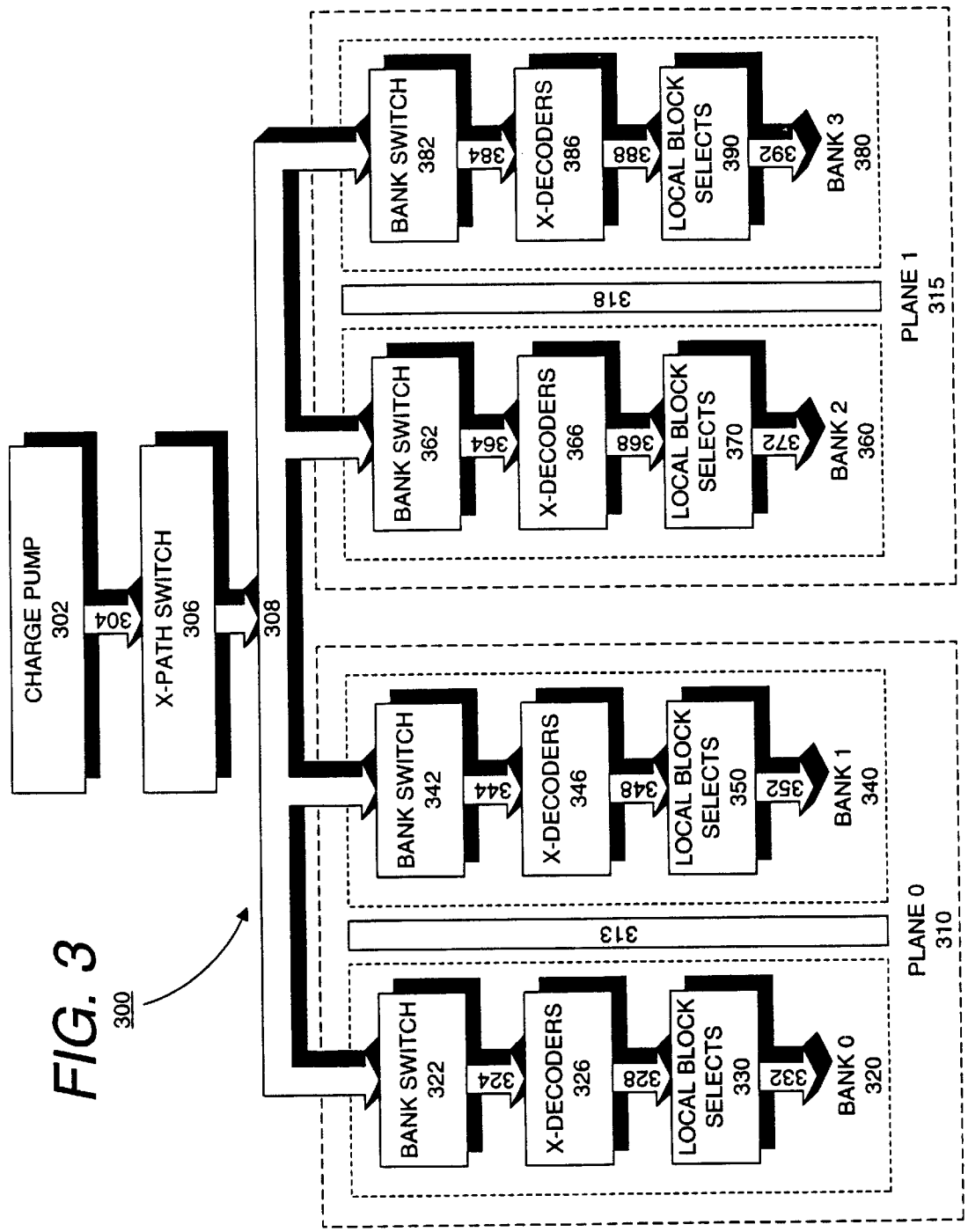
FIG. 3 is a block diagram of the high voltage and banking architecture of one embodiment.

FIG. 3 is a block diagram of the high voltage and banking architecture 300 of one embodiment. The banked architecture 300 in FIG. 3 comprises a charge pump 302, X-path switches 306, and two memory planes 310, 315. Charge pump 302 is coupled to the X-path switches 306. A pumped supply voltage 304 is supplied from the charge pump. For one embodiment, the pumped supply voltage 304 is a positive voltage and the charge pump 302 is a positive charge pump. Alternative embodiments may comprise of a negative charge pump providing a pumped supply voltage 304 of a negative voltage potential. Similarly, the banking architecture can also be applied to the Y-path or W-path in alternative embodiments.

The X-path switches 306 couple the pumped supply voltage 304 to a number of high voltage signals 308. The high voltage signals 308 of one embodiment comprise of VPX, VPIX, VPXNW, and block selects. X-path switches can switch the voltage potentials of these high voltage signals 308 across a range of voltages from a ground potential up to 12 volts depending on the mode of operation. For instance, VPX and VPIX can be 5 volts during read mode. During a programming pulse, VPX and VPIX can be approximately 10 volts. VPX and VPIX can be at a ground potential during a erase sequence.

The memory array is divided into two planes: PLANE 0 310 and PLANE 1 315. Each plane 310, 315 is subdivided into two banks each. PLANE 0 310 comprises of BANK 0 320 and BANK 1 340, whereas PLANE 1 315 comprises of BANK 2 360 and BANK 3 380. Each bank 320, 340, 360, 380 comprises of a bank switch 322, 342, 362, 382, X-decoders 326, 346, 366, 386, and local block selects 330, 350, 370, 390. The memory planes 310, 315 are constructed of continuous rows of flash cells. Dummy rows 313, 318 are inserted between the banks in each memory plane 310, 315 of one embodiment. The dummy rows 313, 318 are used to separate the banks such that each plane of flash memory cells is not broken. However, the N-wells of the X-decoder devices are broken and separated into separate N-wells for this enhancement. The space between the X-decoder N-wells is filled with dummy rows in the memory array to maintain continuity. The dummy rows of one embodiment are unused wordlines for keeping the planes of the memory array contiguous.

Bank selection logic separates the high voltage signals 308 for each bank. The high voltage signals 308 are coupled from the X-path switches 306 to the bank switches 322, 342, 362, 382. The bank switches 322, 342, 362, 382 of the present embodiment provide a separate set of high voltage signals for each bank 320, 340, 360, 380 of memory. For example, the bank switch 322 of BANK0 320 can couple the high voltage signals 308 to circuit devices in its bank when flash memory cells in BANK 0 320 are accessed. Similarly, bank switch 362 of BANK 2 362 can couple the high voltage signals 308 to circuit devices in its bank when memory cells in BANK 2 360 are accessed.

For one embodiment, each set of high voltage signals 324, 344, 364, 384 comprises of VPX, VPIX, VPXNW, and corresponding block selects. Each set of signals is identical except that each set supplies current to a different bank of memory. Hence, when a signal such as VPX transitions from 5 volts to 10 volts in one bank, the amount of capacitance the supply has to charge up is significantly reduced since the individual VPX supply node is only coupled to circuit devices in one bank, and not all four banks.

For simplicity, only BANK 0 320 is described in detail. However, the description of BANK 0 320 also applies to BANK 1 340, BANK 2 360, and BANK 3 380 since each bank of this embodiment are identically constructed. Bank switch 322 couples high voltage signals 308 to the X-decoders 326 of BANK 0 320. The high voltage signals 324 dedicated to BANK 0 320 are provided from the bank switch 322. The local signals 322 are switched versions of the top-level high voltage signals 308. The X-decoders 326 connect global wordlines 328 to supply voltages such as VPX based upon selection logic. The global wordlines 328 typically extend along the entire length of the bank 320. For this embodiment, the length of the memory banks 320, 340, 360, 380 is the same of the length of the planes 310, 315. The global wordlines 328 are coupled from the X-decoders 326 to local block selects 330. The local block selects 330 of one embodiment serve as pass devices that couple the global wordlines 328 and the local wordlines 332 together. The architecture of one embodiment has the flash memory array further divided into blocks. Block select signals turn on and off the block selects of the appropriate block depending on which memory address is being accessed.

Large areas of N-wells are located in the X-decoders and the local block selects due to the number of P type transistors used in those circuits. The embodiment of the invention can reduce the charging current in the part. By dividing the memory array into banks, the X-decoder N-wells are also divided into banks. Hence, the amount of N-well capacitance that needs to be charged as the high voltage nodes transition voltage potentials can be greatly reduced. Thus, the input current during memory programming can also be reduced. The voltage supply node can also slew faster since the capacitance load has been reduced. As a result, program time may be lower.

The method of one embodiment comprises segmenting capacitance that has to charged during programming. The capacitance can be segmented by dividing the memory array into banks, each with its own set of X-decoders. Each bank is also supplied with its own set of supply signals that are coupled to global signals depending on switching logic. A dummy row can be inserted between the banks to maintain continuity between the flash cells in the array.

Figure 4:
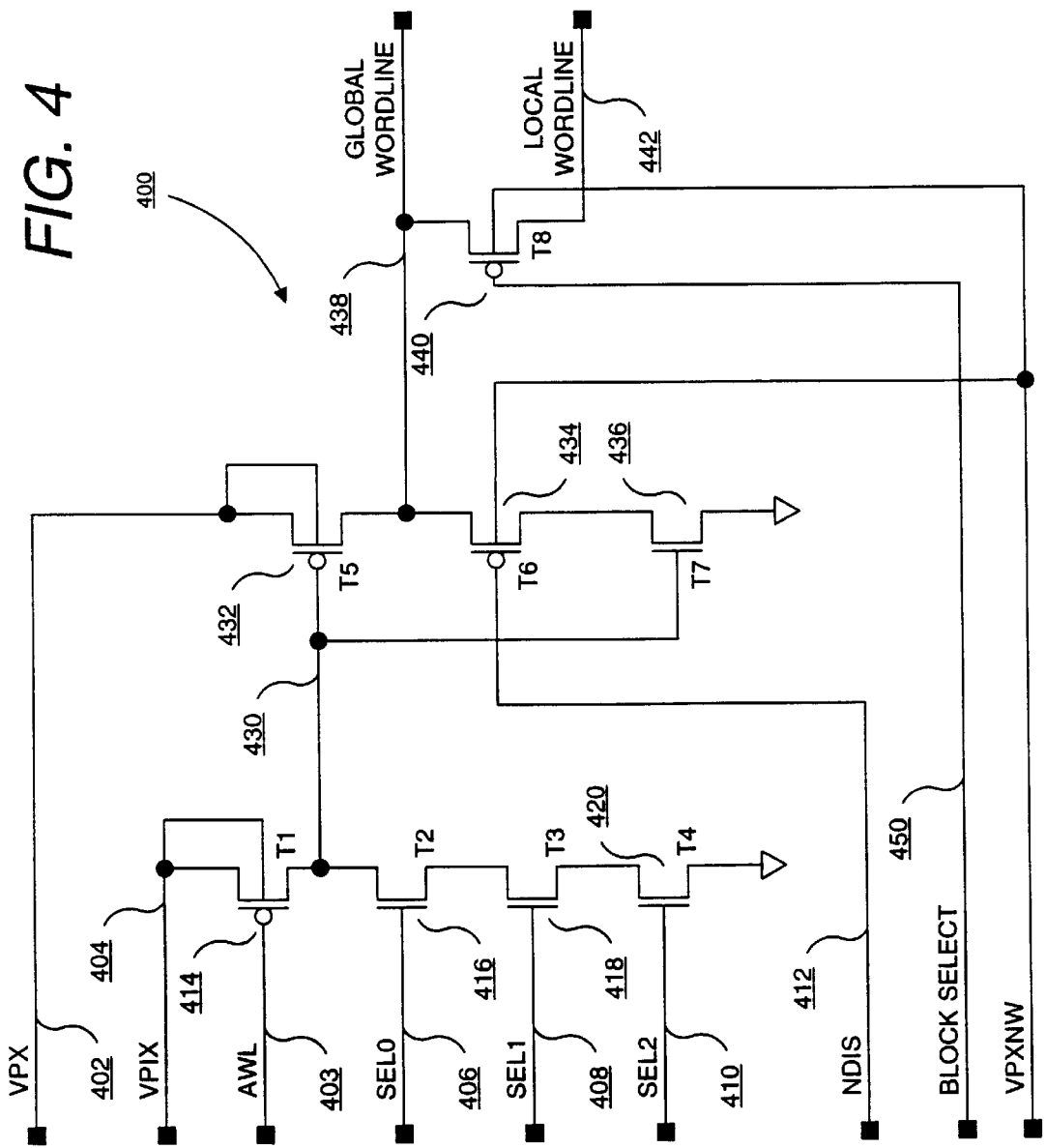
FIG. 4 is a circuit diagram of an X-decoder cell.

FIG. 4 is a circuit diagram of an X-decoder cell 400. The X-decoder cell 400 has a number of signals coupled to its circuit devices including VPX 402, VPIX 404, and various select signals 406, 408, 410. VPX 402 and VPIX 404 are positive voltage supplies for the X-decoder 400.

P type transistor T1 414 is coupled to VPIX 404 at its source terminal. The gate of T1 414 is coupled to an "all wordlines" AWL signal 403. In another embodiment, a ground potential can be coupled to the gate of T1 414. The substrate of T1 414 is also coupled to VPIX 404. N type transistors T2 416, T3 418, T4 420 are coupled together in a series. The drain terminal of T2 416 is coupled at node 430 to the drain terminal of T1 414, the gate terminal of T5 432, and the gate terminal of T7 436. The source terminal of T2 416 is coupled to the drain terminal of T3 418. Similarly, the source terminal of T3 418 is coupled to the drain terminal of T4 420. At one end of the transistor chain, the source terminal of T4 420 is coupled to a ground potential. Select signals SEL0 406, SEL1 408, and SEL2 410 are coupled to the gate terminals of T2 416, T3 418, and T4 420, respectively. The select signals 406, 408, 410 control the discharge of node 430 by providing a path to ground when T2 416, T3 418, and T4 420 are all turned on.

P type transistor T5 432 is coupled to VPX 402 at its source terminal. The substrate terminal of T5 432 is also coupled to VPX 402. The drain terminal of T5 432 is coupled to the source terminal of P type transistor T6 434. The node between the drain terminal of T5 432 and the source terminal of T6 434 is also a global wordline 438. The gate terminal of T6 434 is coupled to the NDIS signal 412. The N well of T6 434 is coupled to VPXNW. Drain terminal of N type transistor T7 436 is coupled to the drain terminal of T6 434. The source terminal of T7 436 is coupled to a ground potential.

T5 432 is the P driver to the global wordline 438. T7 436 is the N driver to the global wordline 438. T6 434 serves as an isolation device to prevent over-stress in the devices coupled between VPX 402 and ground. T6 434 is used to prevent forward bias of the drain to substrate junction of T7 436 during an erase operation, because global wordline 438 is taken to a negative voltage.

A block select signal 450 is coupled to the gate terminal of P type transistor T8 440. T8 440 functions as a local block select device. The source terminal of T8 440 is coupled to a global wordline 438, while the drain terminal is coupled to a local wordline 442. When a logic high on BLOCK SELECT 450 is applied to the gate terminal of T8 440, T8 is turned on and the local wordline 442 is coupled to the global wordline 438. A logic low on BLOCK SELECT 450 keeps T8 440 off. For one embodiment, the BLOCK SELECT 450 can have a negative voltage potential during read mode. The N well of T8 440 is coupled to VPXNW.

Each X-decoder 400 drives a wordline of the memory array. For one embodiment, both the VPX 402 and VPIX 404 supplies are 5 volts during read mode and 10 volts during the program pulse. Every time a word is programmed in the memory array, VPX 402 and VPIX 404 have to be pumped from 5 volts to 10 volts. VPX 402 and VPIX 404 typically have a large amount of capacitance due to the number of wordlines present in the array. For instance, the number of X-decoders 400 for one embodiment of a flash array is 2048.

Each X-decoder cell 400 contributes a certain amount of capacitance. The overall capacitance includes various components such as N-well capacitance, gate capacitance, and diffusion capacitance. The total VPX 402 and VPIX 404 capacitance for one embodiment can be on the order of 500 picofarads to 1 nanofarad for 16 megabit and 32 megabit flash memory parts, respectively.

Raising the VPX 402 and VPIX 404 supply voltages from 5 volts to 10 volts can comprise a significant portion of the total programming current in some flash parts. For instance, the charge in one embodiment is supplied from a charge pump that is powered with a low voltage of typically 3 volts or 1.8 volts. The amount of current necessary to charge VPX 402 and VPIX 404 from 5 volts to 10 volts during a program sequence can be determined by:

$$I_{PP}=C*(V_2-V_1)/(T_P*\text{Pump Efficiency})$$

where C is the supply capacitance and $T_P$ is the program time. $V_1$ is the initial voltage potential and $V_2$ is the subsequent voltage. The charge required is divided by the program time and pump efficiency. For example, if C is 800 picofarads and $T_P$ is 20 microseconds and pump efficiency is 4% when the supply is pumped from 5 volts to 10 volts, then $I_{PP}$=(800 pF)*(10V−5V)/(20 μs*0.04)=5 milliamps. At low voltage, the necessary current is quite large.

Generally, a significant amount of time is required to charge the VPX 402 and VPIX 404 voltage supplies. The time needed to charge VPX 402 can be determined by:

$$T=C*(V_2-V_1)/I$$

where I is the pump output current and C is the capacitance on VPX 402. $V_1$ is the initial voltage potential and $V_2$ Is the subsequent voltage. The time to slew is the charge divided by the charge pump supply current. The charge pump current is dependent on the pump size. If the pump output current is 1 milliamp and C is 800 picofarads when VPX 402 is pumped from 5 volts to 10 volts, then T=(800 pF)*(10V−5V)/1 mA=4 microseconds. For one embodiment, 4 microseconds is approximately a quarter of the program time.

In order to meet the power requirements during program, either the charge pump has to be enlarged or the program time increased. The tradeoff is between spreading the program current over a longer time period versus die area. Current basically depends on the pump size. But a charge pump has limited current capability, so the slew time is also affected. A solution becomes more important when the size of the X-decoders become larger and the associated capacitance increases.

One embodiment of the invention divides the memory array into four banks. Each bank comprises a set of X-decoders. However, the X-decoder N wells are separated. Dummy rows are inserted between the banks in the middle of each plane to separate the two banks on each memory plane. Furthermore, the supply signals and decoding signals are also divided from a global set into a separate set for each bank.

Prior art designs routed each global signal to the circuits for the entire array. Since the signals were global in nature, the N wells for both planes were slewed up and down together no matter where the chip was being programming.

Figure 5:
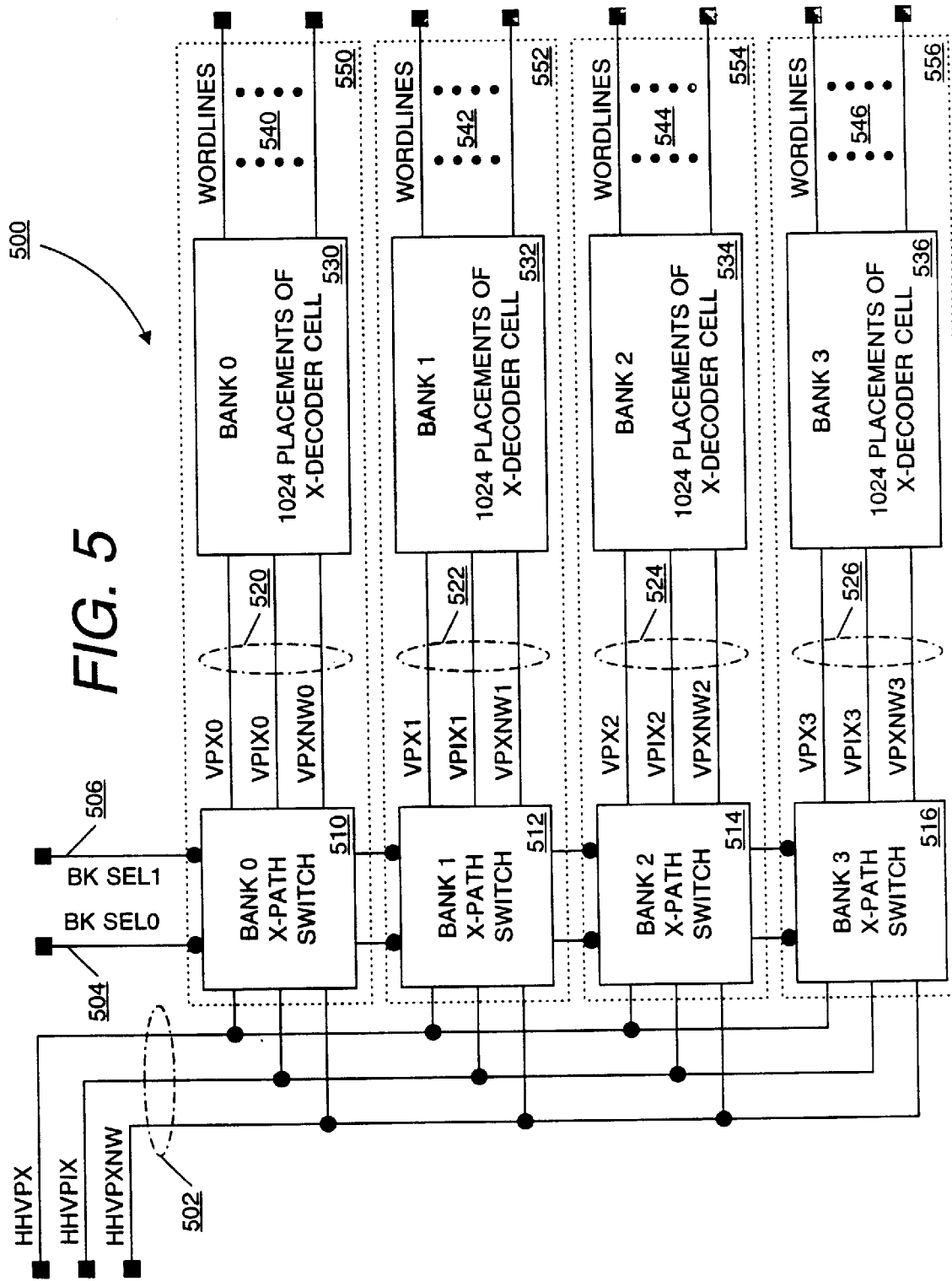
FIG. 5 is a block diagram of a banked memory architecture.

FIG. 5 is a block diagram of a banked memory architecture 500. Global signals 502 of the embodiment in FIG. 5 are generated from a global X-path switch. The global signals 502 comprise of HHVPX, HHVPIX, and HHVPXNW. The banked memory architecture 500 of FIG. 5 comprises of an array divided into four memory banks 550, 552, 554, 556. Each bank 550, 552, 554, 556 has its own X-path switch logic 510, 512, 514, 516 and set of X-decoder cells 530, 532, 534, 536. Global signals 502 are coupled to the X-path switches 510, 512, 514, 516 of all four banks 550, 552, 554, 556.

The X-path switch logic controls whether the voltage potentials from the global pumped signals 502 are coupled to the X-decoders 530, 532, 534, 536 in its corresponding bank. For one embodiment, logic signals BK SEL0 504 and BK SEL1 506 are coupled to all the X-path switches 510, 512, 514, 516. Logic signals BK SEL0 504 and BK SEL1 506 control whether each bank's X-path switch 510, 512, 514, 516 is activated to couple global signals 502 to the bank's local signals 520, 522, 524, 526. Each bank of X-path switches 510, 512, 514, 516 is coupled to its own set of local high voltage signals 520, 522, 524, 526. For this embodiment, each local signal has a corresponding global signal. For instance, global signal HHVPX corresponds to local signals VPX0 of BANK 0 550, VPX1 of BANK 1 552, VPX2 of BANK 2 554, and VPX3 of BANK 3 556. Similarly, global signal HHVPIX corresponds to local signals VPIX0 of BANK 0550, VPIX1 of BANK 1 552, VPIX 2 of BANK 2 554, and VPIX 3 of BANK 3 556. Global signal HHVPXNW corresponds to local signals VPXNW0 of BANK 0 550, VPXNW1 of BANK 1 552, VPXNW2 of BANK2 554, and VPXNW3 of BANK 3 556.

The four memory banks 550, 552, 554, 556 of the present embodiment are identically constructed. For illustrative purposes, only BANK 0 550 is described in detail. Bank 0 X-path switch 510 can supply the global signals 502 to the local high voltage nodes 520. Local signals 520 are coupled to a set of BANK 0 X-decoder cells 530. Each set of X-decoder cells in this embodiment comprises of 1024 placements of an X-decoder cell. The X-decoder cells 530 are coupled to wordlines 540 extending into the memory array. Each X-decoder cell is coupled to one wordline.

For one embodiment, wordlines 540 are global wordlines. The architecture of one embodiment has the flash memory array further divided into blocks. Block select devices as shown in FIG. 4 can couple local wordlines to the global wordlines. Local block selects can serve as pass devices that couple the global wordlines and the local wordlines together. Block select signals turn on and off the block selects of the appropriate block depending on which memory address is being accessed.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method for reducing program current comprising:
   segmenting a capacitance that has to be charged into a first portion and a second portion, wherein said capacitance comprises of a plurality of X-decoders and N-wells;
   routing global signal lines to said first and second portions, said global signal lines to carry global signals;
   providing control logic to select either said first portion or said second portion for charging based on whether said first portion or said second portion is being enabled; and
   inserting a first dummy row in a memory array coupled to said capacitance, wherein said plurality of X-decoders switch said global signals to and from memory cells in said memory array.

2. The method of claim 1 wherein said dummy row is an unused wordline to keep said memory array contiguous.

3. The method of claim 1 wherein a second dummy row is inserted into said memory array.

4. The method of claim 1 wherein said segmenting comprises dividing said memory array into a plurality of banks, each of said banks comprising memory cells.

5. The method of claim 4 wherein each of said banks comprises a set of X-decoders.

6. The method of claim 5 wherein N-wells of said banks are separate.

7. The method of claim 6 further comprising generating local signals on local signal lines for each of said banks.

8. The method of claim 7 wherein said generating comprises using switching logic to couple said global signals on said global signal lines to said local signals lines.

9. The method of claim 8 wherein each of said banks comprises of switching logic.

10. The method of claim 9 wherein a bank is activated when an address in said bank is accessed.

11. The method of claim 6 wherein said first dummy row separates two of said banks.

* * * * *